Sept. 16, 1969 L. JULIE 3,467,912

SENSITIVE REGENERATIVE AMPLIFIER

Filed Nov. 1, 1966 2 Sheets-Sheet 1

INVENTOR
LOEBE JULIE

BY [signature]
ATTORNEY

INVENTOR
LOEBE JULIE
BY E. S. Lovette
ATTORNEY

3,467,912
SENSITIVE REGENERATIVE AMPLIFIER

Loebe Julie, New York, N.Y., assignor to Julie Research Laboratories, Inc., New York, N.Y., a corporation of New York Filed Nov. 1, 1966, Ser. No. 591,233
Int. Cl. H03f 1/36, 3/68
U.S. Cl. 330—104 12 Claims

ABSTRACT OF THE DISCLOSURE

A high-gain amplifier for the amplification of weak input signals operates with switching of a first signal. The first signal is switched from an exponential or rapidly rising mode to cut-off to a stable state. The second signal, which is the input or control signal, is at a lower frequency than the first signal and affects the rate of gain of the first signal.

This invention relates to amplification systems, and more particularly to methods and means for amplifying weak signals.

There are many types of devices for amplifying electrical or mechanical signals. When the input signals are very weak, however, the amplifier gain must be exceedingly high in order to detect a measurable output signal. Electrical amplifiers of this type often require many tubes or transistors, or very expensive specialized electronic equipment. Mechanical amplifiers of this type also require complicated mechanisms, such as elaborate gear trains.

It is a general object of this invention to provide a high-gain amplifier, in both electrical and mechanical embodiments, which is of minimum cost and complexity, and which is particularly suitable for the amplification of low frequency and even DC signals.

In accordance with the principles of my invention the amplifier is capable of operating in an unstable mode. An input signal causes the amplifier output to exhibit a run-away condition. In an electronic amplifier this means that the output transistor, for example, approaches saturation or cut-off. In a mechanical amplifier the output indicating mechanism approaches its maximum limit of movement. While the run-away condition persists the output signal is approximately linearly dependent upon the input signal, but once the maximum limit is reached, the maximum value of the output is a function only of the amplifier characteristics. If the amplifier is allowed to operate in the unstable mode until after this limit is reached it is, of course, incapable of providing an output signal which is linearly proportional to the input signal.

For this reason an amplifier constructed in accordance with the principles of my invention is continuously switched back and forth between stable and unstable modes of operation. When the amplifier is operating in the stable mode, the output signal may be proportional to the input signal, but the gain of the amplifier is not sufficient to provide an easily measured output level. When the amplifier is switched to the unstable mode, the output starts to run away, the output function typically being exponential in form. Typically, before the output approaches its maximum limit, the amplifier is switched back to its stable mode of operation. Although in the unstable mode the output rapidly approaches the maximum limit, until it reaches this point the output is a function of the input. Thus, when the amplifier is switched back to the stable mode of operation, the output, at that instant, is equal to the input multiplied by a large amplification factor. While the amplifier is in its stable mode the output is reduced to a low level. Thus, for two different input signals the output levels in the stable state are generally different but of very small magnitudes. But the maximum output signals in the unstable state are considerably different. Consider, for example, two input signals of .0001 volt and .0002 volt, and an electronic amplifier with a minimum gain in the stable state of 10. Suppose further that the amplifier is allowed to operate in its unstable state until the output signal has grown to 10,000 times the input signal. In the first case, at the end of the stable period of operation the output signal is (10)(.0001) or .001 volt. When the amplifier is switched to the unstable state the output signal begins to run away, typically exponentially. When the amplifier is switched to the unstable state the output signal begins to run away, typically exponentially. When the amplifier is switched back to the stable state the output signal is at a level of (10,000)(.0001) or 1 volt. The output then is restored to the stable state level of .001 volt in preparation for the next unstable operation. In the second case with an input of .002 volt, the minimum and maximum output signals are .002 and 2 volts. While the stable output levels of .001 and .002 volt may be difficult to measure or utilize, the output signals of 1 and 2 volts may be distinguished easily.

The rise of the output during each period of unstable operation may be exponential in form, as may be the decay in the output signal during each period of stable state operation. It is possible to provide a detecting mechanism which determines the maximum output signal which is reached at the end of each period of unstable operation. On the other hand, a filter may be provided at the output terminal which smooths the continuing rises and falls in the output signal so that an average value is determined. In this latter case, the output in the run-away mode may be allowed to saturate. The "area" under the alternating waveform is integrated to provide a value dependent on the rate of rise of the run-away sections of the waveform. As long as the run-away sections are dependent on the input signal, the integrated or average output signal is a function of the input signal. For example, the output signal may be a logarithmic function of the input.

One of the major advantages of this method is that low frequency and even DC signals may be thus amplified. As long as the frequency of the switching back and forth between the stable and unstable modes of operation is greater than the maximum frequency in the input signal whose magnitude must be measured, the detected or measured output signal will follow the input signal, distinguished from it of course in that it has been amplified considerably. The method of my invention appears at first glance to be similar to that employed in super-regenerative detectors which are used in radio receivers. That the two techniques are different, however, can be appreciated from the fact that the prior art detector is usually useful for amplifying an input signal of only a single frequency. Moreover, this single frequency is usually quite high, e.g., in the order of hundreds of kilocycles. The differences between the technique of my invention and that used in the prior art will be explained in greater detail below. At this point it is noted, however, that the switching frequency employed in an amplifier constructed in accordance with the principles of my invention is considerably greater than the maximum frequency in the input signal to be amplified, whereas the reverse is true in the case of the prior art detector. Also, the prior art super-regenerative technique has not been found suitable for amplifying mechanical signals, which is not the case with my new method.

It is a feature of this invention to provide an amplifier which is switched back and forth between stable and run-away modes of operation.

It is another feature of this invention to switch the amplifier back and forth between the two modes of operation at a rate greater than maximum frequency in the input signal to be amplified.

Further objects, features and advantages of my invention will become apparent upon consideration of the following detailed description in conjunction with the drawings, in which.

Figure 1:
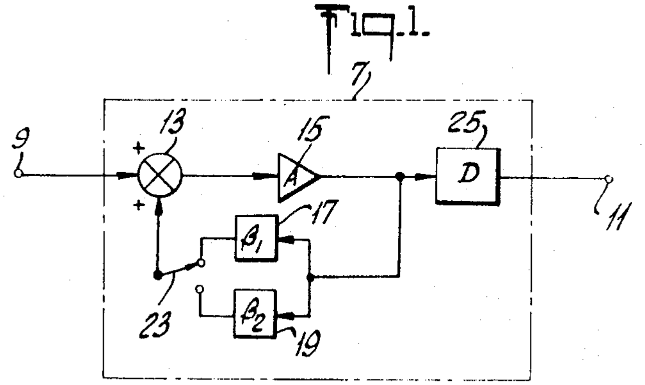
FIG. 1 is a block diagram schematic illustrating symbolically the principles of my invention.

Referring to FIG. 1, amplifier system 7 is included between input terminal 9 and output terminal 11. The input signal is applied to one of the two inputs of summer 13. The output of the summer is amplified by amplifier 15 and the amplified output is fed back to the two feedback networks 17 and 19. The former multiplies the signal by a factor of $\beta_1$ and the latter multiplies the signal by a factor $\beta_2$. These multiplication factors are usually less than but may be greater than one. Switch 23 alternates between the outputs of the two feedback networks, and whichever network is connected to the switch has its output directed to the second input of summer 13. Feedback network $\beta_1$ is such that the product of the amplification factor (A) of amplifier 5 and the multiplication factor of network 17, $A\beta_1$, is greater than 1. The product $A\beta_2$ is less than 1. (It may be negative.) As is well known in the electronic art if the product $A\beta$ is greater than 1, regeneration occurs. Thus, when switch 23 is connected to network 17, the output of amplifier 15 grows exponentially. When switch 23 is switched to network 19, the output decays from its peak value to a relatively low value. As switch 23 is cycled back and forth, the output continuously rises and falls. The output signal is sensed or filtered by unit 25 and the final signal at terminal 11 has the magnitude of the input signal at terminal 9 multiplied by a large constant.

The frequency of the switching of switch 23 is made greater than the maximum frequency in the input signal to be amplified. In such a case the system will provide an output signal which follows the input signal. If the input is DC, the output will be amplified DC. A filter in detector 25 is required only if the output must be smoothed. Alternatively, a peak detector may be used if all that is desired is the maximum level reached at the output of amplifier 15.

In addition to the frequency of the switching, another important characteristic of the system resides in the period of the regenerative state of operation. There is a physical limit to the magnitude of the output signal, which limit is determined by the characteristics of amplifier 15. If the output is to follow and be proportional to the input, this limit must not be reached. Thus, the regenerative operation must cease before the limit is reached. The time period may be determined easily by a quantitative analysis or observation if the maximum magnitude of the input signal is known. If the output is allowed to be a non-linear function (e.g., logarithmic) of the input, the system may be allowed to operate partially in the maximum limit region.

Figure 2:
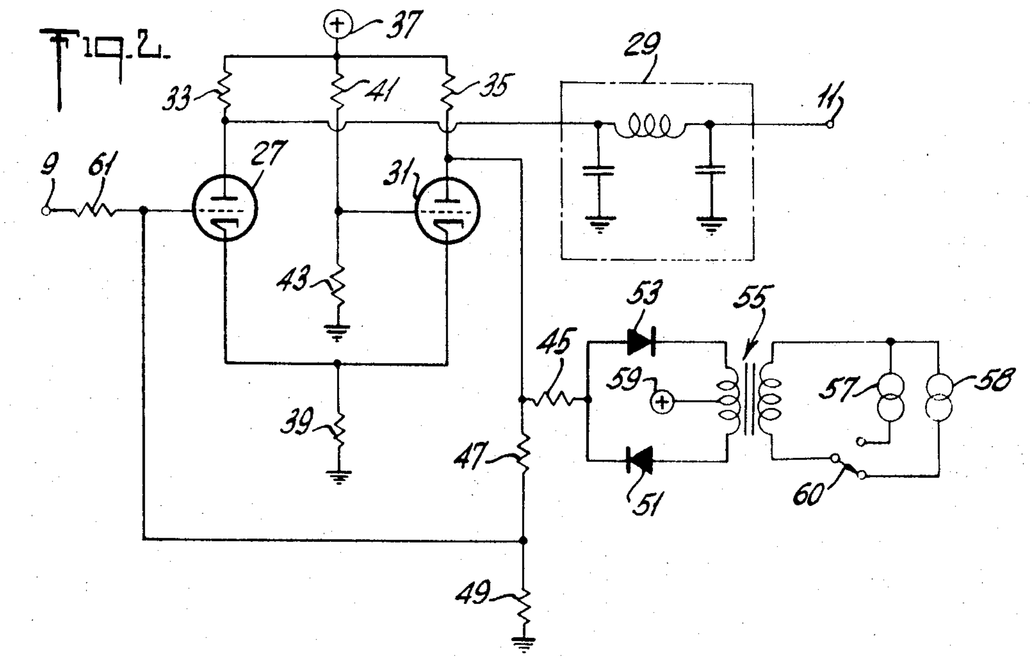
FIG. 2 is a first illustrative embodiment of my invention as applied to an electronic amplifier.

The block diagram of FIG. 1 has been described with reference to regenerative (also as "positive") feedback. This type of analysis is convenient because the technique for analyzing systems with feed back are well known. The electronic embodiment of the invention, shown in FIG 2, is based on the block diagram of FIG. 1. But the invention is not limited to systems incorporating positive feedback. In fact, in the mechanical embodiment of FIG. 5 there is no "feedback" whatsoever. While the characteristic of some systems incorporating the principles of my invention is that they exhibit alternate periods of positive and negative feedback, or alternate periods of signal regeneration and degeneration, the common characteristic of all systems incorporating the principles of my invention is that there are alternate periods of stable and runaway operations. By virtue of this common characteristic, the system output tends to run away toward the maximum limit determined by the physical characteristics of the system. While the run-away condition persists the output itself is a function of the input. It may grow exponentially toward the maximum value, but while it is growing it is a function of the input level. The system is then switched to its stable state. The output must, of course, decay or be restored to a suitably low value during the stable period in preparation for the next run-away operation. But during the stable state, the output does not necessarily reach the same limit for all values of input signal. It is possible, of course, that during the stable state the output returns to a zero level. But it may also return to a level which is a function of the input signal. The stable period of operation can take many forms and is characterized chiefly by the fact that the output signal gets much smaller in magnitude.

For example, in an electrical embodiment of the amplifier of FIG. 1, $\beta_2$ may have a multiplying factor of zero (no feedback) and the stable state is reached by the exponential discharge of capacitances in the circuit. This discharge may also be facilitated by using sections of switch 23 to short circuit these capacitances during the stable period of operation. At the termination of the period of stable operation, the system runs away once again.

Not only can the precise nature of the stable and unstable operations vary, but in addition the method of detection may vary. The detector may merely detect the maximum level of the output signal, it may detect the average level of this signal, or it may perform other functions on the output waveform. In any case, the great sensitivity of the system arises from the run-away which occurs in alternate cycles of operation. The growth of the output signal during these periods of operation may be by a factor of hundreds of thousands, and the output signal is always a function of the input signal so that the over-all configuration serves as a high-gain or ultrasensitive amplifier.

Figure 3:
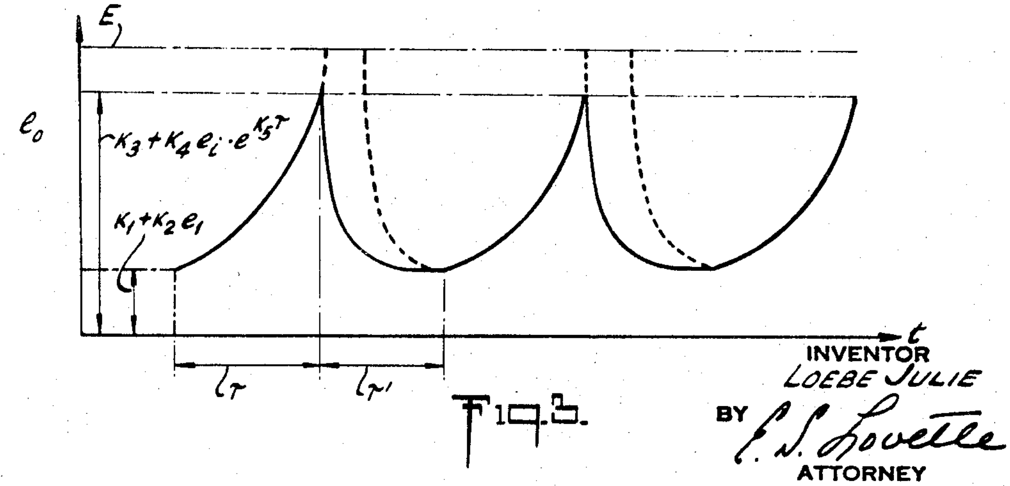
FIG. 3 shows the form of the output signal (before it is smoothed) in the amplifier of FIG. 2 as a function of time.

The first embodiment of the invention, an electronic amplifier, is shown in FIG. 2. The input signal is applied between input terminal 9 and ground. The output signal, of the form shown in FIG. 3, is taken from the plate of tube 27. The "jagged" output signal is smoothed by filter 29 and the resulting signal between output terminal 11 and ground follows the input signal, the output signal, however, being of considerably greater magnitude. The basic amplifier which is used in FIG. 2 is the well-known difference amplifier, or cathode-coupled amplifier. Many other types of amplifiers may be used and the difference amplifier is merely illustrative. While the plate of each of tubes 27 and 31 is coupled through a respective resistor, 33 and 35, to plate supply 37, the two cathodes are connected to the same resistor 39. The grid signal for tube 31 is constant, the grid being connected to the voltage divider comprising resistors 41 and 43. The signal at the plate of tube 27 is opposite in polarity to the input signal. (This means, of course, that an inverter should be connected in the output circuit if it is desired that the output have the same polarity as the input.) The signal at the plate of tube 31 has the same polarity as the input signal.

The switching between the two modes of operation is controlled by either alternating current source 57 or 58, depending on the position of switch 60. During every other half-cycle of operation the cathode of diode 53 is positive in potential and the anode of diode 51 is negative in potential. Both diodes are non-conducting and effectively resistor 45 is uncoupled from the junction of resistor 47 and the plate of tube 31. In alternate half-cycles, the cathode of diode 53 is negative in potential and the anode of diode 51 is positive in potential. Both diodes conduct and the positive potential of source 59 is extended through the secondary winding of transformer 55, the two diodes, and resistor 45 to the junction of resistor 47 and the plate of tube 31.

The operation of the circuit may be best understood by considering illustrative values. Resistor 35 is 40,000 ohms, resistor 45 is 500 ohms, resistor 47 is 1 megohm and resistor 49 is .25 megohm. Resistors 33, 41, 43 and 39 have values such that the gain of the two tubes from the grid of tube 27 to the plate of tube 31 is +58 when resistor 45 is effectively removed from the circuit in alternate half-cycles. This gain of +58 from the grid of one tube to the plate of the other is equivalent to the gain from the input of amplifier 15 in FIG. 1 to its output. Since the signal at the plate of tube 31 appears across resistors 47 and 49, and resistor 49 is one-fourth the magnitude of resistor 47, the gain from the grid of tube 27 to the resistor junction is one-fifth the gain from the grid to the plate of tube 31. The impedance seen looking into the junction of the two resistors is approximately equal to the impedance of resistors 47 and 49 connected in parallel, which is 200K. If resistor 61 also has a magnitude of 200K (this magnitude includes the output impedance of the signal source) half of the feedback signal appears across this resistor. Consequently, the gain around the loop from the grid of tube 27 back to it is 58/(5)(2) or +5.8. This gain is greater than unity and as a result the positive feedback results in a run-away condition. Another way of defining the amplifier operation in these alternate half-cycles is to state that the system exhibits a pole in the root-locus diagram. When the diodes are first cut-off the output at the plate of tube 27 grows exponentially. The time constant of the exponential curve is a function of the amplifier parameters, and the coefficient of the exponential is proportional to the input signal applied at terminal 9.

On the other hand, consider the other half-cycles during which the two diodes conduct. In this case, the plate of tube 31 is not only returned through resistor 35 to source 37, but in addition through resistor 45 to source 59. It is well known that the gain from the grid of one tube to the plate of the other tube in a different amplifier is proportional to the plate load impedance of the second tube. With resistor 45 in the circuit the effective plate impedance is approximately 500 ohms, the impedance of resistor 45, rather than 40K, the impedance of resistor 35. Since the gain from the grid of tube 27 to the plate of tube 31 during the stable operation is approximately one-eightieth of the gain during the unstable operation, the total loop gain is +5.8/80. Since the loop gain is less than unity, the system is stable, and the output at the plate of tube 27 does not grow exponentially and remains stable.

The output waveforms at the plate of tube 27 for sources 57 and 58 are shown in FIG. 3, the output for source 58 being shown by dotted lines. The two sources control two different types of operations. Both have the same frequency, but their duty cycles are different. Source 57 controls a run-away mode period ($\tau$) which is shorter than the run-away mode period determined by source 58. Conversely, the stable mode period ($\tau'$) of source 57 is longer than that of source 58. The maximum output signal is shown as E. With source 57 this level is not reached. With source 58 it is reached.

Consider first the operation with source 57 connected by switch 60 to transformer 55. For a particular input signal $e_i$ the output $e_o$ is of the form $k_1+k_2e_i$ at the end of each period of stable operation. As soon as the diodes are cut off, the output grows exponentially, the growth being of the form $e_ie^{k5t}$. The exponential growth continues for the duration of the run-away mode of operation. The period of the unstable operation is $\tau$ seconds, where $\tau$ is sufficiently small such that tube 27 does not cut off. (The magnitude of $\tau$ chosen in any particular application depends, of course, on the maximum value of $e_i$.) After $\tau$ seconds have elapsed the diodes conduct once again. The output potential drops quickly to a value which is proportional to the magnitude of the input signal. The drop is not instantaneous due to the stray capacitance at the plate of tube 27 and elsewhere, but the drop is steep and the output potential quickly reaches the same value observed at the beginning of the complete cycle. The period of the stable operation may be made as small as possible to allow the output of filter 29 to be as large as possible.

The minimum and maximum values of $e_o$ for a particular $e_i$ are shown in FIG. 3. The gain of the amplifier is so large that the minimum value is negligible compared with the maximum value. For all practical purposes, therefore, the filter output is dependent upon only the maximum output signal. Excluding the constant value $k_3$ which appears in the output signal for all values of the input, the output signal is equal to the input signal multiplied by the factor $k_4e^{k5\tau}$. This amplification factor can be enormous in magnitude compared to the ordinary gain which can be obtained from two tubes operating as linear amplifiers. The factor $k_4e^{k5\tau}$ can be in the order of hundreds of thousands and even millions.

With source 58 in the circuit, rather than source 57, $\tau$ is increased and $\tau'$ is decreased. The output, during the unstable period, reaches the maximum level, E, and remains there until the stable operation begins. It then drops down to the $k_1+k_2e_i$ minimum level. The output is shown by the dotted curves. The area under the output waveform is still a function of the input because the rate of rise of the exponential curve is proportional to the magnitude of $e_i$. The greater $e_i$, the faster is the rise and the area under the waveform. Consequently, the filter output is still a function of the input signal. This type of operation may be very useful if a non-linear amplifier is required.

It should be noted that in both modes of operation in the circuit of FIG. 2 (with either source) the feedback is positive. The loop gain in one case is +5.8 and in the other it is +5.8/80. But when the loop gain is the latter value it is less than unity and consequently a stable operation ensues. Other arrangements are possible. For example, instead of providing positive feedback all the time, with different values of $\beta$ in alternate periods of operation, it is possible to provide positive and negative feedback alternately. The positive feedback may be the same as that provided in FIG. 2, with resistor 45 effectively removed from the circuit and the output of tube 31, of the same polarity as the input signal, being fed back to the grid of tube 27. The switching mechanism, instead of reducing the value of $\beta$ during the stable periods, may instead control the connection of the upper end of resistor 47 to the plate of tube 27. Since the polarity of the signal at this plate is opposite to that of the input signal the feedback is negative during the stable periods of operation. All that is required is that the amplifier be switched constantly between a stable condition and a run-away condition.

Figure 4:
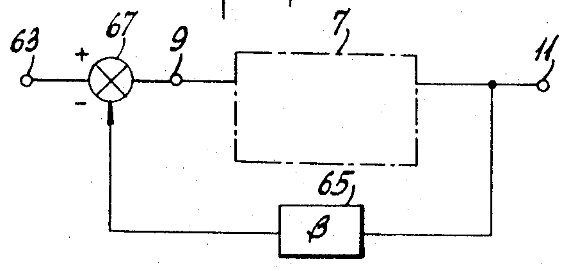
FIG. 4 illustrates schematically the manner in which the gain of the amplifier of FIG. 2 may be more linear.

While it is sometimes necessary that an amplifier operate linearly, i.e., the output at terminal 11 of FIG. 2 always being equal to the magnitude of the input signal multiplied by a predetermined constant, this condition is not always necessary as described above. For example, it may be necessary only to provide a very high-gain amplifier for the purpose of sensing the input signal rather than precisely amplifying its magnitude. If it is necessary, however, to provide a highly constant gain amplifier well-known techniques are available for linearizing the operation of the amplifier of FIG. 2. (Even with source 57 in the circuit the amplifier may not be linear enough for some applications.) A commonly used circuit for this purpose is shown added to the basic amplifier in the circuit of FIG. 4. Here the entire block diagram circuit of FIG. 1, with input terminal 9, amplifier 7 and output terminal 11, is included in the circuit with an additional input circut 63, subtractor 67 and feedback network 65. The input signal is applied to terminal 63 rather than to terminal 9. If the total gain from terminal 9 to terminal 11 is A, it can be easily shown that the gain from terminal 63 to terminal 11 is $A/(1+\beta A)$. This can be rewritten as $(1/\beta/[1+(1/A\beta)]$. Suppose that the minimum and maximum values of A are 10,000 and 100,000, and that $\beta$ has a value of 1/1,000. In such a case, the minimum and maximum values of the over-all gain are 909.09 and 990.09. The gain in both cases is considerable, yet the maximum variation is less than 10%.

Other feedback connections are possible. For example, the output voltage may control the magnitude of $\beta$ or the switching rate itself if the system is to be provided with an automatic range selecting mechanism.

Figure 5:
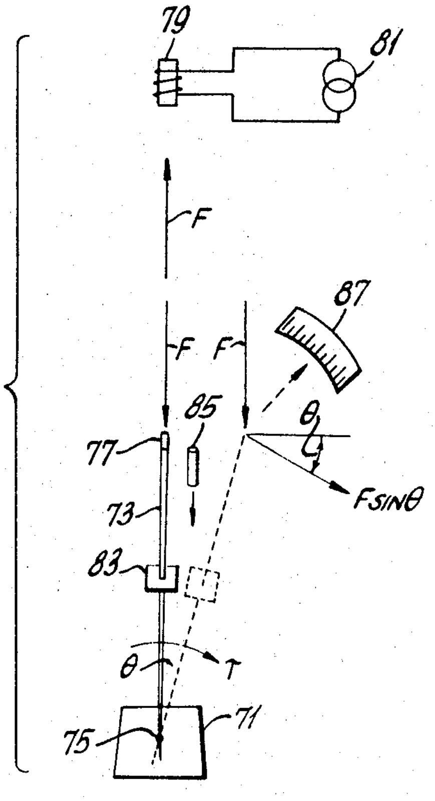
FIG. 5 is a second illustrative embodiment of my invention as applied to a mechanical amplifier.

Before proceeding to an examination of the mechanical embodiment of the invention shown in FIG. 5, it will be helpful to compare the circuit of FIG. 2 with the well-known super-regenerative detector. The input signal is usually a modulated carrier. The modulating signal may have a frequency range in the order of kilocycles, the carrier frequency being in the hundreds of kilocycles or megacycle range. The detector has an input tuned circuit which is utned to the carrier frequency and even a very small magitude input signal of the proper carrier frequency initiates oscillations in the detector. The envelope of the oscillations rises exponentially but the rate of the rise is proportional to the amplitude of the initiating signal. A quench oscillator is provided for the purpose of interrupting the oscillations so that the output of the detector is a series of groups of oscillations, the series occurring at the quench frequency and each group of oscillations consisting of an exponentially rising and then decaying envelope. Since each envelope rises at a rate proportional to the amplitude of the initiating signal, the peaks of the envelopes follow the modulating signal on the carrier.

In the super-regenerative detector the quench oscillator frequency is smaller than the frequency at which the amplifier oscillates so that a group of oscillations is formed which defines an envelope. In my invention the "quench" frequency is greater than the maximum frequency is greater than the maximum frequency in the input signal to be amplified. Otherwise, the output cannot follow the input in waveform shape. Moreover, the output in the circuit of FIG. 2 does not consist of a series of groups of oscillations. Each "jagged" section of the output waveform does not define the *envelope* of an oscillating signal. The amplifier itself does not oscillate except insofar as the switching frequency causes the mode of operation to switch back and forth. The super-regenerative detector is characterized by two frequencies, the quench frequency and the frequency of the oscillations. The detector of FIG. 2 is characterized only by a switching frequency (which might be though of as a "quench" frequency) but exhibits no oscillations within the output "envelope." Thus only the switching frequency must be filtered out to obtain an output signal which follows the input. There is no carrier frequency to eliminate. The principles of operation are therefore completely different in the two circuits and the only similarity is that they both exhibit a time-controlled regeneration.

It should also be noted that the super-regenerative detector exhibits three modes of operation—increasing oscillations, decreasing oscillations and non-amplification, the first two comprising each envelope and the third separating the series of oscillations. In the circuit of FIG. 2 there are only two modes of operation. Also, in the unstable mode of the super-regenerative detector the unfiltered output signal is alternating and thus its slope varies. In the unstable mode of an amplifier designed in accordance with the principles of my invention, the slope of the run-away sections of the waveform is always unidirectional (for a constant input signal).

Unlike the super-regenerative detector which oscillates at a particular frequency and is therefore sensitive only to input signals of this frequency, the circuit of FIG. 2 is capable of amplifying signals of any frequency and even DC signals. All that is required for the output to follow the input is that the switching frequency be greater than the maximum frequency in the input signal to be amplified. There are therefore no tuning problems in the circuit of FIG. 2.

An illustrative mechanical embodiment of the invention is shown in FIG. 5. Unit 71 is a transducer which converts an input signal to a torque T, the torque moving indicator 73 clockwise around pivot 75. The input signal to the transducer may be mechanical, electrical or of some other form. The angular deflection produced by the torque is very small, and the purpose of the amplifier is to amplify the deflection.

The tip of the indicator is a permanent magnet 77. Electromagnet 79 is operated by alternating current source 81, and as the polarity of the source (which is preferably a square wave oscillator) changes the magnetic polarity of electromagnet 79 switches. The force F exerted on magnet 77 alternates between the upward and downward directions. When $\theta$ is zero the electromagnet applies no torque to indicator 73 since the force F is parallel with it. However, if the indicator is not vertical but displaced slightly in the clockwise direction as a result of an input torque T, the force F does result in indicator movement. When the force is in the downward direction the indicator moves clockwise. In alternate half-cycles with the force in the upward direction, the indicator is pulled back toward its central position.

It will be shown below that the maximum deflection is equal to an initial deflection $\theta$ multiplied by a large constant. It is this maximum deflection that must be detected and measured. This can be accomplished in a variety of manners. In the illustrative embodiment of FIG. 5, mirror 83, light source 85 and scale 87 are used for this purpose. This type of detecting mechanism is well known in the art. The mirror is secured to the indicator with its axis parallel to that of the indicator. The light beam from source 85 is reflected off the mirror and strikes the scale. Depending on the angular deflection of the indicator and mirror, the light beam impinges at a different point on the scale. Actually as the indicator moves back and forth the light beam illuminates a strip of the scale. Thus, the width of the illuminated portion of the scale is an indication of the indicator maximum deflection. In FIG. 5, the indicator is shown in its vertical position. The indicator is shown in dotted form at an angle $\theta$ for the purpose of illustrating the force components applied to the tip of the indicator at this angle.

Suppose the mechanical input signal results in a clockwise torque T on the indicator, and that this torque is sufficient when the force F is in the upward direction to deflect the indicator slightly, at an angle $\theta_0$. If the transducing mechanism is linear (galvanometer movements, for example, operate linearly) and $\theta_0$ is always directly proportional to the mechanical input signal, and if the final output signal, the maximum value of $\theta$, can be shown to be some constant times $\theta_0$, then the mechanism operates as a linear high-gain amplifier.

The electromagnet is far above the tip of the indicator, and the force F can always be considered to attract or repel the tip of the indicator in a vertical direction. With the indicator at any angle $\theta$, the force which is perpendicular to the indicator is $F \sin \theta$. If the force F is down, the perpendicular component has the direction shown in FIG. 5. When the force F is up during the stable state, the component $F \sin \theta$ is in the direction opposite to that shown in the drawing. In either case, the torque applied to the indicator is $Fl \sin \theta$, where $l$ is its length from the pivot point 75. This torque is in the clockwise direction during the period of unstable operation. If the input torque, in the clockwise direction, is KX, where K is a constant and X is the magnitude of the input signal, the total clockwise torque during the unstable period is $Fl \sin \theta + KX$. Thus, if the indicator has a movement of inertia I around the pivot point, the motion of the indicator during the unstable period is defined by the equation $$Fl \sin \theta + KX = I\frac{d^2\theta}{dt^2}$$

Just prior to the switching of the system to the unstable state the indicator in the equilibrium position is at an angle $\theta_0$. The torque supplied by the electromagnet to the indicator is $Fl \sin \theta_0$ and is in a direction opposite to the shown in the drawing. Since the indicator is not in motion, the two torques KX and $Fl \sin \theta_0$ must be equal and thus $X = (Fl\ \theta_0)/K$. Substituting for X in the differential equation, $$Fl \sin \theta + Fl \sin \theta_0 = I\frac{d^2\theta}{dt^2}$$

It is now assumed that even in the unstable mode of operation the maximum $\theta$ which is obtained is small. While $\theta_0$ may be too small to measure, the maximum $\theta$ is much larger; but it is still small enough such that the approximation $\sin \theta = \theta$ hold true. Consequently, the differential equation reduces to $$Fl\theta + Fl\theta_0 = I\frac{d^2\theta}{dt^2}$$

This equation has a solution of the form $\theta = ae^{bt} + c$. Substituting for $\theta$ in the differential equation, $$Fl(ae^{bt} + c) + Fl\theta_0 = Iab^2e^{bt},$$

where $$\frac{d^2(ae^{bt})}{dt^2} = ab^2e^{bt}$$

Since the differential equation must hold true for all values of $t$, the constant terms on the left side of the equation must be equal to 0. Thus, $$Flc + Fl\theta = 0 \text{ and } c = -\theta_0$$

Substituting $c = \theta_0$ in the equation $\theta = ae^{bt} + c$ and recalling that at $t = 0$, $\theta = \theta_0$, the equation for $\theta_0$ reduces to $\theta_0 = a(l) - \theta_0$ and $a = R\theta_0$. Equating the exponential terms in the differential equation, and substituting for $a$ and $c$, the following equality is obtained:

$$Fl(2\theta_0)e^{bt} = I(2\theta_0)b^2e^{bt}$$

From this equation, $$b = \sqrt{\frac{Fl}{I}}$$

Thus, the final solution is $$\theta = 2\theta_0 e^{\sqrt{\frac{Fl}{I}}t} - \theta_o$$

If the period of the unstable operation is $\tau$, the maximum deflection is represented by the equation $$\theta_{max} = \theta_0 \left[ 2e^{\sqrt{\frac{Fl}{I}}\tau} - 1 \right] = K_1\theta_0$$

where $$K_1 = 2e^{\sqrt{\frac{Fl}{I}}\tau} - 1$$

Thus, the maximum deflection is always equal to the initial deflection times a large constant $K_1$, and the system operates as a linear high-gain device.

In the system of FIG. 5, at the end of each period of unstable operation the indicator returns to $\theta_0$. During each run-away operation the indicator moves rapidly (exponentially) and when the polarity of the electromagnet reverses the indicator has reached the position $K_1\theta_0$. In all cases, $\theta_0$ is small but proportional to the input signal. The maximum deflection is proportional to the initial deflection but greatly amplified. In the system of FIG. 5, there is a visual indication of the output signal amplitude—the length of the illuminated area of the scale.

The input signal may be steady or variable. But as long as the frequency of the polarity switching is greater than the maximum frequency in the input signal to be amplified, the magnified output follows the input. The output in both the electrical and mechanical cases grows exponentially. This exponential growth is not essential in practicing the invention however. Any type of run-away growth may be utilized to produce the high-gain characteristic. It should be noted that to practice the invention it is not necessary to provide a recognizable form of feedback, even positive feedback in the run-away mode. There is in fact no such feedback in the system of FIG. 5.

Although the invention has been described with reference to two particular embodiments, it is to be understood that these embodiments are merely illustrative of the application of the principles of the invention. Numerous modifications may be made therein and other arrangements may be devised without departing from the spirit and scope of the invention.

What is claimed is:

1. An amplifier including input means for receiving an input signal to be amplified and output means for supplying a response indicative of said input signal, said amplifier amplifying the input signal appearing at said input means; controlling means for alternatively and continuously switching said amplifier to operate in first and second modes, means for operating said amplifier in a first run-away astable mode which heads toward a maximum limit but is a function of said input signal during its growth; and means for operating said amplifier in a second stable mode which is less than said maximum limit; wherein said switching means operates at a switching rate greater than the maximum frequency of the input signal.

2. An amplifier in accordance with claim 1 wherein said controlling means is operative to govern the period of operation of said amplifying means in said first mode to be insufficient in duration for allowing said output signal to reach said maximum limit.

3. An amplifier in accordance with claim 1 wherein said controlling means is operative to govern the period of operation of said amplifying means in said first mode to be sufficient in duration for allowing said output signal to reach said maximum limit.

4. An amplifier in accordance with claim 1 and including means operative in said second mode to derive an output signal which is also a function of said input signal.

5. An amplifier in accordance with claim 1 wherein said controlling means includes means for switching from either of said first and second modes immediately upon the termination of the operation in the other of said modes.

6. An amplifier in accordance with claim 1 and including means operative in said run-away mode to derive an output signal whose slope at all points is of the same polarity when said input signal is a constant value.

7. An amplifier in accordance with claim 1 and including means operative in said run-away mode for deriving an output signal which is proportional to said input signal but grows exponentially in time.

8. An amplifier in accordance with claim 1 and including means operative in said run-away mode for deriving an output signal which follows said input signal with the addition only of harmonics of the frequency of said switching rate, and further including means for filtering out said harmonics to derive an output signal which follows said input signal.

9. An amplifier in accordance with claim 1 further including means for deriving an average value signal from said output signal.

10. An amplifier in accordance with claim 1 further including means for determining the maximum value of said output signal at the end of the operations of said amplifying means in said run-away mode.

11. An amplifier in accordance with claim 1 wherein said amplifier is an electronic amplifier having a feedback network with a loop gain in said first mode which is greater than unity and a loop gain in said second mode which is less than unity, and said controlling means includes means for changing the value of said loop gain to control alternate operations in said first and second modes.

12. An amplifier in accordance with claim 1 further including feedback network means for feeding back said output signal to said input means to linearize the operation of the amplifier.

References Cited

UNITED STATES PATENTS

| | | | |
|---|---|---|---|
| 2,625,650 | 1/1953 | Spencer | 330—112 X |
| 3,264,569 | 8/1966 | Lefferts | 330—112 X |
| 3,264,572 | 8/1966 | Lefferts | 330—112 X |
| 3,264,573 | 8/1966 | Lefferts | 330—112 X |
| 3,329,909 | 7/1967 | Blonder | 331—178 |
| 3,369,186 | 2/1968 | Lejon | 330—10 |

ROY LAKE, Primary Examiner

JAMES B. MULLINS, Assistant Examiner

U.S. Cl. X.R.

330—110, 112

PO-1050
(5/69)

UNITED STATES PATENT OFFICE
CERTIFICATE OF CORRECTION

Patent No. 3,467,912 Dated September 16, 1969

Inventor(s) Loebe Julie

It is certified that error appears in the above-identified patent and that said Letters Patent are hereby corrected as shown below:

Column 7, line 5 - "circut" changed to -- circuit --;

Column 7, line 28 - "utned" changed to -- tuned --;

Column 7, line 47 - "is greater than the maximum frequency" deleted;

Column 7, line 59 - "though" changed to -- thought --;

Column 9, line 16 - "the" (first occurrence) changed to -- tha

Column 9, line 18 - formula changed to read: -- $X = (Fl \sin \theta_o)/K$ --;

Column 9, line 27 - "hold" changed to -- holds --;

Column 9, line 43 - formula changed to read: -- $Flc + Fl\theta_o = 0$ and $c = -\theta_o$ Column 9, line 46 - formula changed to read: -- $a = 2\theta_o$ --

SIGNED AND SEALED
JUN 2 1970

(SEAL)
Attest:

Edward M. Fletcher, Jr.
Attesting Officer

WILLIAM E. SCHUYLER, JR.
Commissioner of Patents